(12) United States Patent
Haishima

(10) Patent No.: US 6,255,138 B1
(45) Date of Patent: Jul. 3, 2001

(54) PROCESS FOR PRODUCING MICROENCAPSULATED ELECTROCONDUCTIVE FILLER

(75) Inventor: Takahiro Haishima, Tokyo (JP)

(73) Assignees: Three Bond Co., Ltd., Tokyo; Fujitsu Limited, Kanagawa, both of (JP)

( * ) Notice: Subject to any disclaimer, the term of this patent is extended or adjusted under 35 U.S.C. 154(b) by 0 days.

(21) Appl. No.: 09/102,351

(22) Filed: Jun. 23, 1998

(30) Foreign Application Priority Data

Jun. 23, 1997 (JP) .................................................. 9-180250

(51) Int. Cl.⁷ .................................................. H01L 21/44
(52) U.S. Cl. .......................... 438/119; 438/106; 438/118; 438/120; 438/121; 438/124
(58) Field of Search .................................... 438/119, 106, 438/118, 120, 121, 124, 126, 127, 98, 57, 209

(56) References Cited

U.S. PATENT DOCUMENTS

| | | | |
|---|---|---|---|
| 4,620,987 | * 11/1986 | Yamashita et al. | 427/131 |
| 5,790,926 | * 8/1998 | Mizoe et al. | 399/174 |
| 5,861,324 | * 1/1999 | Ichinose et al. | 438/119 |

FOREIGN PATENT DOCUMENTS

| | | | |
|---|---|---|---|
| 0 539 211 | 4/1993 | (EP) | H01L/21/60 |
| 62-76215 | 4/1987 | (JP) | H01B/1/02 |
| 63-237372 | 10/1988 | (JP) | H01R/11/01 |
| 5-320413 | 12/1993 | (JP) | C08K/7/00 |

* cited by examiner

*Primary Examiner*—Matthew Smith
*Assistant Examiner*—V. Yevsikov
(74) *Attorney, Agent, or Firm*—Sughrue, Mion, Zinn, Macpeak & Seas, PLLC

(57) ABSTRACT

A process for producing a microencapsulated electroconductive filler comprising conductive filler particles each having an insulating resin coated on the surface thereof, which comprises: a first step of treating the surface of conductive filler particles with a coupling agent having reactive functional group A at a terminal end or in a side chain of its molecule; and a second step of allowing the coupling agent having functional group A present on the surface of the conductive filler particles to undergo non-aqueous polymerization reaction with a reactant B which is polymerizable with the functional group A, to thereby form an insulating resin layer on the surface of the conductive filler particles.

21 Claims, 2 Drawing Sheets

PROCESS FOR PRODUCING MICROENCAPSULATED ELECTROCONDUCTIVE FILLER

FIELD OF THE INVENTION

This invention relates to a microencapsulated electroconductive filler. More particularly, the invention relates to a process for producing a microencapsulated electroconductive filler by coating the surfaces of electroconductive filler particles with an insulating polymer. The electroconductive filler can be used, for example, in an anisotropic conductive adhesive by being incorporated in an insulating adhesive.

BACKGROUND OF INVENTION

As recent models of electrical and electronic parts are becoming smaller in size and thickness, the electrical circuits used in those models are required to have a higher packing density and a finer definition. Interconnections of such miniature circuits are conventionally established by using anisotropic electroconductive adhesives. Among such anisotropic conductive adhesives, those which are shaped in sheet are commonly used in connecting terminals of a circuit board to a flexible circuit. A recent attempt made in the art is to apply an anisotropic conductive adhesive when a semiconductor chip is to be directly mounted on a circuit board (see, for example, JP-A-5-320413 (The term "JP-A" used herein means an unexamined published Japanese patent application)).

In order to establish electrical connections using an anisotropic conductive adhesive, terminals having a plurality of electrodes arranged at spacings of several tens of micrometers to several thousand micrometers and other terminals to be connected that also have similarly spaced electrodes are press bonded to each other, with the anisotropic conductive adhesive being interposed, such that electrical path is formed only between opposed electrodes. However, if the addition of the conductive filler is excessive or not uniform, or if the resin becomes fluid when the opposed terminals are pressed, two adjacent electrodes may occasionally be shorted as shown in FIG. 5.

In order to prevent the shorting of adjacent electrodes, JP-A-62-76215, JP-A-62-176139 and JP-A-63-237372 have proposed the use of a particulate conductive filler having the surfaces of filler particles coated with a thermoplastic resin, and JP-B-8-2995 (The term "JP-B" used herein means an examined Japanese patent publication) has proposed the use of a particulate conductive filler having the surfaces of filler particles coated with a thermosetting resin.

As described above, JP-B-8-2995 discloses a process for producing the particulate conductive filler having the surfaces of filler particles coated with a thermosetting resin. Specifically, a solvent and conductive fine particles (oil phase) that have been already treated with a coupling agent so that reactant A is present on the surface, are dispersed in water (aqueous phase) that has dissolved therein a reactant B which is capable of reacting with reactant A, to thereby form a suspension. By applying heat or by adding a catalyst to the suspension, the two reactants are allowed to react with each other on the surfaces of the conductive filler particles to form an insulating resin.

A problem with this technique is that due to the presence of oil- and water-soluble ingredients, a complicated procedure has been required to isolate and recover the coated microcapsules of conductive filler. As a result, the overall manufacturing process is complicated, involving many steps while lacking the operating efficiency and the adaptability for mass production. If the microencapsulated filler is to be used in fixing IC chips and the like, the entrance of impurity ions such as chloride ions should be avoided by all means since they corrode electrodes and other components to lower the device reliability. To meet this requirement, additional steps of purification may have been necessitated.

SUMMARY OF INVENTION

An object of the invention is to solve the above described problems of the conventional techniques.

Other objects and effects of the present invention will become apparent from the following description.

The above described objectives of the present invention have been achieved by proving the following constitutions.

(1) A process for producing a microencapsulated electroconductive filler comprising conductive filler particles each having an insulating resin coated on the surface thereof, which comprises:

a first step of treating the surface of conductive filler particles with a coupling agent having reactive functional group A at a terminal end or in a side chain of its molecule; and a second step of allowing said coupling agent having functional group A present on the surface of said conductive filler particles to undergo nonaqueous polymerization reaction with a reactant B which is polymerizable with said functional group A, to thereby form an insulating resin layer on the surface of said conductive filler particles.

(2) The process according to the above (1), wherein said coupling agent having functional group A used in said first step is at least one compound selected from the group consisting of an aluminum-base coupling agent, a titanate-base coupling agent, a silane-base coupling agent and a zircoaluminate-base coupling agent.

(3) The process according to the above (1), wherein the addition amount of said coupling agent having functional group A in said first step is from 0.1 to 15 wt % based on the weight of said conductive filler particles to be treated.

(4) The process according to the above (1), wherein said surface treatment of said first step comprises the steps of:

dissolving said coupling agent having functional group A in a solvent to form a solution of said coupling agent; and then dispersing said conductive filler particles into the solution.

(5) The process according to the above (4), wherein said dispersing step to disperse said conductive filler particles into the solution is conducted by mixing with agitation.

(6) The process according to the above (4), wherein said dispersing step to disperse said conductive filler particles into the solution is conducted by applying ultrasonic waves with agitation.

(7) The process according to the above (1), wherein said coupling agent is an amine compound having an amino or imino group as said functional group A, and said reactant B is a compound having an epoxy group at a terminal end or in a side chain of its molecule.

(8) The process according to the above (1), wherein said coupling agent is an epoxy compound having an epoxy group as said functional group A, and the reactant B is an amine compound having an amino or imino group at a terminal end or in a side chain of its molecule.

(9) The process according to the above (1), wherein said second step comprises a step of dispersing said coupler-treated conductive filler particles uniformly in the reactant B.

(10) The process according to the above (9), wherein said second step further comprises a step of performing polymerization reaction between the reactant B and the coupling agent having functional group A under agitation.

(11) The process according to the above (9), wherein said dispersing step to disperse said coupler-treated conductive filler particles uniformly in said reactant B is conducted using an agitator running at an agitation rate of 2,000 to 10,000 rpm.

(12) The process according to the above (11), wherein the reactant B is of a liquid nature.

(13) The process according to the above (12), wherein said reactant B has a viscosity of 20 to 20,000 mPa·s (25° C.).

(14) The process according to the above (1), wherein said second step is conducted while heating the reaction system to from 40 to 60° C.

(15) The process according to the above (1), wherein said second step further comprises adding a polymerization catalyst to the reaction system.

The present invention also relates to an anisotropic conductive adhesive comprising an insulating adhesive and a microencapsulated electroconductive filler prepared by the process as claimed in claim 1.

The present invention also relates to an electronic component comprising two or more terminals each having a plurality of electrodes, said terminals being interconnected with one another using an anisotropic conductive adhesive which comprises an insulating adhesive and a microencapsulated electroconductive filler prepared by the process as claimed in claim 1.

The present invention also relates to a process for producing an electronic component comprising two or more terminals each having a plurality of electrodes, which comprising:

a step of interconnecting said terminals using an anisotropic conductive adhesive which comprises an insulating adhesive and a microencapsulated electroconductive filler prepared by the process as claimed in claim 1.

DETAILED DESCRIPTION OF THE INVENTION

Figure 1:
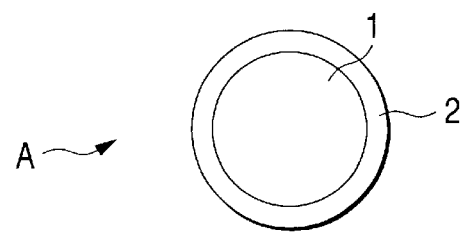
FIG. 1 is a diagram schematically showing a microcapsule of electroconductive filler which is coated with an insulating resin, as prepared in accordance with the present invention.

The electroconductive filler for use in the invention may be made of any materials as long as they are electrically conductive, and preferred examples thereof are fine particles of conductive metal such as Ag particles and Cu particles having a Ag coat on the surface.

The conductive filler particles are desirably spherical or pseudospherical, and their size or diameter is suitably smaller than the distance between adjacent electrodes on an electronic component and the like; generally, their size is preferably 50 μm or less, more preferably 10 μm or less.

Description is made below with respect to the coupling agent having reactive functional group A and the reactant B which reacts with the functional group. The purpose of using the coupling agent in the invention is to ensure that the insulating resin layer produced by the polymerization between the reactive group A and the reactant B adhere firmly to the surfaces of the conductive filler particles which typically comprise fine metal particles.

Depending on the compatibility with the reactive group A, various types of coupling agents may be used as the coupling agent for use in the present invention, and suitable examples thereof include aluminum-base coupling agents, titanate-base coupling agents, silane-base coupling agents and zircoaluminate-base coupling agents.

The functional group A and the reactant B which reacts therewith may be of any types as long as they are capable of reacting with each other to form an insulating resin layer on the surface of the conductive filler particles. Example of the combination thereof include a combination such that the function group A is an epoxy group and the reactant B is an amine compound, or a combination such that the functional group A is an amine compound having an amino or imino group and the reactant B is a compound having an epoxy group.

Taking into account the compatibility of the coupling agent having the reactive functional group A with the reactant B, if the reactant B is an epoxy resin, examples of preferred coupling agent include a titanate-base coupling agent having an amino group, a silane-base coupling agent having an amino group, and a zircoaluminate-base coupling agent having an amino group. If the reactant B is an amine compound having an amino or imino group, the coupling agent is preferably a silica-base coupling agent having an epoxy group.

Examples of the epoxy resin for use as the reactant B include, but are not limited to, EPICLON 850CRP (bisphenol A type; product of DAINIPPON INK & CHEMICALS, INC.), EPICLON 830LVP (bisphenol F type; product of DAINIPPON INK & CHEMICALS, INC.) and mixtures thereof.

Examples of the amine compound for use as the reactant B include, but are not limited to, THREE BOND 2103 (aliphatic polyamine; product of Three Bond, K.K.) and THREE BOND 2105 (modified polyamidoamine; product of Three Bond, K.K.).

Examples of the titanate-base coupling agent having an amino group include isopropyltri(N-aminoethyl.aminoethyl)titanate (PLENACT KR44 of Ajinomoto Co., Inc.), etc. Examples of the silica-base coupling agent having an amino group include N-β(aminoethyl)γ-aminopropyltrimethoxysilane, N-β(aminoethyl)γ-aminopropylmethyldimethoxysilane, γ-aminopropyltrimethoxysilane, etc.

Examples of the silica-base coupling agent having an epoxy group include γ-glycidyloxypropyltrimethoxysilane, γ-glycidoxypropyldimethoxysilane, etc.

The process of producing the microencapsulated conductive filler of the invention is described below. The first step in the process is for treating the conductive filler particles with the coupling agent which is typically used in an amount of from 0.1 to 15 wt %, preferably from 1 to 10 wt %, based on the weight of the conductive filler. If less than 0.1 wt % of the coupling agent is used, it is difficult to provide a uniform coating on the surfaces of the conductive filler particles. If more than 15 wt % of the coupling agent is used, the conductive filler particles may agglomerate. By adjusting the addition of the coupling agent within the above described range, the thickness of an insulating resin coat formed on the surfaces of the conductive filler particles can be controlled. The thickness of the insulating resin coat to be formed is variable depending on the intended purposes, conditions under which the product is used and other factors, but it is preferably not more than 3 $\mu$m.

The coupling treatment of the first step is generally performed by dissolving the coupling agent having the functional group A in a solvent such as an organic solvent and then dispersing the conductive filler particles in the resulting solution through mixing under agitation. Alternatively, dispersing of the conductive filler particles may be accomplished by application of ultrasonic energy from an oscillator preferably operating at frequencies in the range of from 20 to 100 kHz, more preferably from 20 to 50 kHz. Outside the frequency range of 20 to 100 kHz, the coupling agent becomes difficult to deposit on the surfaces of the fine metal particles.

The second step in the process for producing the microencapsulated conductive filler of the invention generally comprises: a step of dispersing the coupler-treated conductive filler particles uniformly in the reactant B which is polymerizable with the functional group A; and a step of performing polymerization reaction between the reactant B and the coupling agent having the functional group A under agitation. In order to ensure that the coupler-treated conductive filler particles are uniformly dispersed in the reactant B, the latter is preferably of a liquid nature.

If necessary, a second step may contain additional steps such as a step of adding a solid epoxy resin and a step of controlling the viscosity of the reaction mixture by addition of a solvent. However, considering the operating efficiency and other factors, it is preferred that the reactant B is liquid at ordinary temperatures and is free of solvents. More preferably, the reactant B should contain, as less as possible, impurity ions (in particular, chloride ions).

In the second step, the coupler-treated conductive filler particles may be uniformly dispersed in the reactant B by means of a homogenizer. If a homogenizer is to be used, its rotating rate is suitably in the range of from 2,000 to 10,000 rpm. If the rotating rate of the homogenizer is slower than 2,000 rpm, it is difficult to disperse the fine metal particles uniformly; if the rotating rate of the homogenizer is faster than 10,000 rpm, the fine metal particles may be damaged.

For employing a homogenizer in dispersing under agitation in the second step, the reactant B is preferably of a liquid nature showing a viscosity of 20 to 20,000 mpa·s (at temperatures ranging from ordinary temperatures to elevated temperatures that are to be used in the subsequent polymerization step, particularly at 25° C.). If the viscosity of the reactant B is less than 20 mPs·s or greater than 20,000 mPa·s, it is sometimes difficult to achieve uniform dispersing by the homogenizer.

In the second step, the reaction of nonaqueous polymerization between the reactant B and the coupling agent having the functional group A is preferably accelerated by heating the reaction system or by adding a polymerization catalyst to the reaction system. If heating is to be done, the temperature is preferably heated to from 40 to 60° C.

If the heat generated by agitation with the homogenizer raises the temperature of the reaction system so that the temperature of the reaction system becomes suitable for polymerizing the reactant B with the reactive group A in the coupling agent, the polymerization reaction may be initiated spontaneously without particular heating. If the temperature rise is more than necessary, cooling may be applied to control the polymerization reaction.

By the process described above, there are produced microcapsules of conductive filler, an example of which is schematically shown in FIG. 1 as particle A, which has an insulating resin layer 2 formed on the surface of a conductive filler particle 1.

In the process of the invention, the coupling agent having the reactive functional group A is selectively adsorbed on the surfaces of conductive filler particles 1 to reduce their tendency to agglomerate. Hence, by adjusting the amount of adsorption (addition) of the coupling agent, the thickness of the insulating resin layer 2 can be controlled to a desired value.

The thus produced microcapsules of conductive filler can be easily isolated from the system comprising the microcapsules and unreacted reactant B in admixture, for example, by dissolving the residual (unreacted) reactant B in a solvent that is free from impurity ions and the like and which can dissolve the liquid reactant B.

In case where unreacted liquid reactant B is used as a component of an anisotropic conductive adhesive, even the step of isolating the microencapsulated conductive filler can be obviated to realize a substantial reduction in the number of production steps involved.

The present invention will be described in greater detail with reference to the following Examples, but should not be construed as being limited thereto.

The production steps of the microencapsulated conductive filler are described below step by step with reference to the following Examples.

EXAMPLE 1

A microencapsulated anisotropic electroconductive adhesive was prepared from the ingredients listed below.

Fine conductive particles:
    Ag (average size, 7 $\mu$m: spherical)
Coupling agent:
    Isopropyltri(N-aminoethyl.aminoethyl)titanate (PREN ACT KR44 of Ajinomoto Co., Inc.)
Liquid reactant:
    Bisphenol F type epoxy resin (viscosity, 2,000 mPa·s/ 25° C.)

(1) Preparation of Microencapsulated Conductive Filler (1-1) Treating Fine Metal Particles with Coupling Agent To 110 g of ethanol, 6.0 g of the amino group containing titanate-base coupling agent and 95 g of the Ag particles were added, and the mixture was held at 50° C. and was subjected to dispersing by sonication for 30 min. Subsequently, the dispersion was left to stand until the metal particles precipitated, and the supernatant was removed by decantation, followed by complete removal of ethanol with a desiccator. As a result, the fine metal particles treated with the coupling agent on their surfaces were obtained in an amount of 95 g.

In Example 1, the amino group containing titanate-base coupling agent required the use of ethanol as the solvent, but this is not necessarily the case if other coupling agents are used. Further, in the case of using other coupling agent, the temperature and the time required for the treatment, as well as the yield of the final product, will also change.

(1-2) Dispersing the Fine Metal Particle

Ninety grams of the coupler-treated fine metal particles were added to 150 g of the epoxy resin (i.e., liquid reactant) and dispersing was done under agitation by means of a homogenizer at 6,000 rpm for 10 min.

In Example 1, an epoxy resin having a viscosity of 2,000 mpa·s at 25° C. was used as the liquid reactant B. However, this is not the sole case of the invention and the liquid reactant B may be of any nature that is effective for dispersing with agitation by means of the homogenizer.

(1-3) Polymerization Reaction

The conductive filler dispersion obtained in (1-2) was agitated at 250 rpm with a three-one motor to perform polymerization reaction at 50 to 60° C. for 2 h. The rotating rate of the three-one motor is preferably controlled such that the fine metal particles neither settle nor deposit on the wall surfaces of the reaction vessel. To give a guide figure, the rotational rate is preferably in the range of from 50 to 450 rpm if the reaction vessel has a capacity of about from 0.2 to 10 L. As the result of the polymerization reaction, a coat of the insulating epoxy resin was formed on the surfaces of the conductive filler particles. The thickness of the insulating resin coat is preferably not more than 3 μm.

(1-4) Isolation of the Microencapsulated Conductive Filler

The microcapsules of conductive filler prepared in (1-3) were washed with a solvent, and then desiccated to isolate.

(2) Checking for the Insulating Property of the Micro-encapsulated Conductive Filler The conductive filler prepared in (1-4) was distributed over a comb-shaped copper electrode and examined for its insulating property. The result is shown in Table 1 below.

TABLE 1

| Run | 20-μm gap | 40-μm gap |
|---|---|---|
| Example 1 | 3.0 | 4.0 |
| Example 3 | shorted | 4.0 |

(Unit: ×10$^{12}$ Ω)

As shown in Table 1, the two comb-shaped electrodes, one having 20-μm gaps and the other having 40-μm gaps, were insulated adequately, demonstrating the satisfactory insulating property of the microencapsulated conductive filler.

(3) Preparation of Conductive Adhesive

To an epoxy-base one-liquid adhesive (TB2271; product of Three Bond, K.K.), 7 vol % (based on the volume of the adhesive) of the microencapsulated conductive filler prepared in (1) was introduced and mixed therewith. The mixture was well agitated to disperse the conductive filler particles uniformly, thereby yielding a microencapsulated anisotropic conductive adhesive.

The microencapsulated anisotropic conductive adhesive preferably contains the microcapsules of the conductive filler in an amount of from 3 to 60 vol %, and preferably has a viscosity of no more than 150,000 mPa·s.

As for the binder resin for use in the anisotropic conductive adhesive, conventionally known binder resins that have a bonding capability to provide anchorage for the conductive filler particles in electronic components, etc. so as to establish conductive path between terminals may be used. Specific examples thereof include thermoplastic resins such as olefinic resins, styrene-ethylene-butadiene copolymer resins, styrene-butadiene resins, vinyl acetate-ethylene copolymer resins, urethane resins, vinyl chloride resins and acrylic resins, and other resins such as epoxy resins, isocyanate resins (urethane resins), silicone resins and (meth) acrylate resins ((meth)acrylic resins). Considering heat resistance, adhesion stability and corrosive effect on the electrodes to be connected, and also considering the constituent material for the shell of the microcapsules of conductive filler, the use of epoxy-resin base adhesives are preferred.

(4) Chip-Substrate Bonding Test

Figure 2:
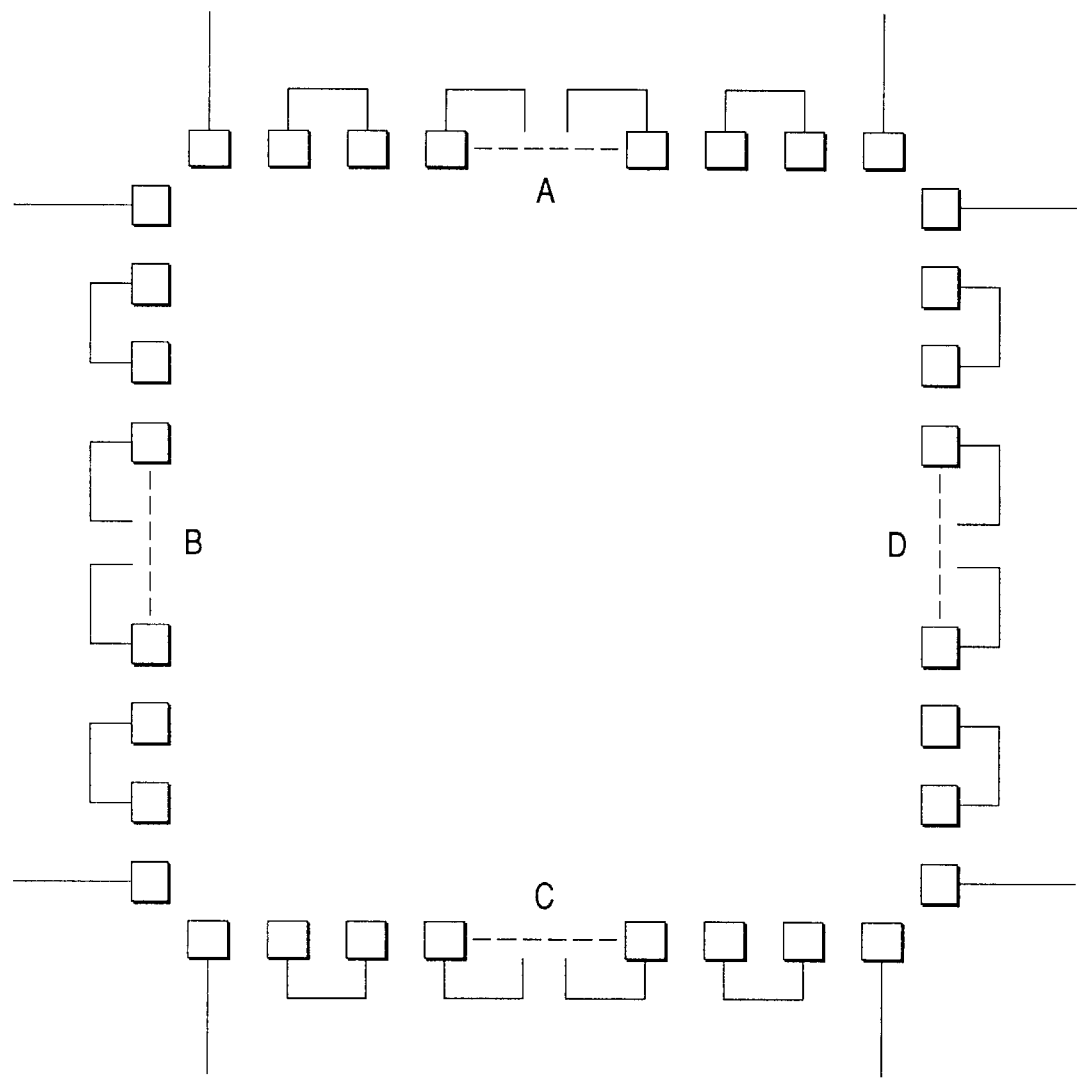
FIG. 2 is a diagram schematically showing the sites at which conduction resistance and insulation resistance were measured in Examples of the invention.
Figure 3:
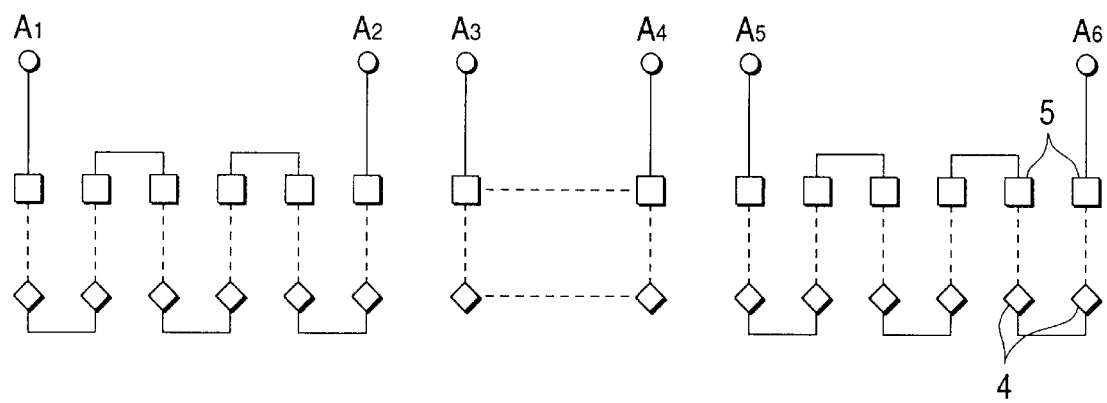
FIG. 3 is a partially enlarged view of FIG. 2.

The anisotropic conductive adhesive prepared in (3) was uniformly applied to provide a thickness of 40 μm onto a substrate (with 240 pads that were 100 μm wide and spaced apart at a pitch of 125 μm) as shown in FIG. 2. To the coated side of the substrate, a glass chip fitted with 240 bumps each having a diameter of 80 μm was thermocompressed at 170° C. for 30 sec at a pressure of 35 g per bump. The thus obtained bonded sample is schematically illustrated in FIG. 3. The above bonding operation is to connect pads 5 with the respective opposite bumps 4. $A_1$ to $A_6$ each represents an electrode. Illustration of electrodes, pads and bumps intervening between $A_3$ and $A_4$ are omitted in FIG. 3. Thus, circuit 1 (from electrode $A_1$ to electrode $A_2$) to circuit 5 (from electrode $A_5$ to electrode $A_6$) and insulated portion 1 (between electrodes $A_2$ and $A_3$) to insulated portion 4 (between electrodes $A_4$ and $A_5$) were formed in the bonded sample. Circuits 2 to 4 and insulated portions 2 and 3 are not shown in FIG. 3.

(5) Continuity and Insulation Tests on Micro-encapsulated Anisotropic Conductive Adhesive The bonded sample prepared in (4) was subjected to a continuity test using a four-terminal method and to an insulation test with a high-resistance meter (insulation resistance tester). The result of the conduction test is shown in Table 2, and the results of the insulation test is shown in Table 3. The sides A, B, C and D in Tables 2 and 3 correspond to those shown in FIG. 2.

TABLE 2

| | Circuits for measurement | | | | |
|---|---|---|---|---|---|
| Side measured | 1 | 2 | 3 | 4 | 5 |
| A | 0.60 | 0.63 | 0.66 | 0.68 | 0.69 |
| B | 0.61 | 0.61 | 0.66 | 0.70 | 0.72 |
| C | 0.61 | 0.65 | 0.67 | 0.70 | 0.72 |
| D | 0.55 | 0.57 | 0.61 | 0.66 | 0.59 |

(Unit: Ω)

As shown in Table 2, each circuit under test showed a satisfactory conduction resistance which was less than 1.0Ω (<0.2Ω per a point of connection).

TABLE 3

| | Insulated portions under test | | | |
|---|---|---|---|---|
| Side measured | 1 | 2 | 3 | 4 |
| A | 2.5 | 2.2 | 1.8 | 2.0 |
| B | 2.1 | 1.9 | 2.2 | 1.7 |
| C | 2.0 | 2.6 | 2.2 | 1.8 |
| D | 1.8 | 1.2 | 1.8 | 2.0 |

(Unit: 10$^{11}$ Ω)

As shown in Table 3, the insulation resistance between adjacent conducting patterns were all excellent as higher than 10$_{11}$Ω, though the adhesive contained the filler in an amount as large as 7 vol %.

Figure 4:
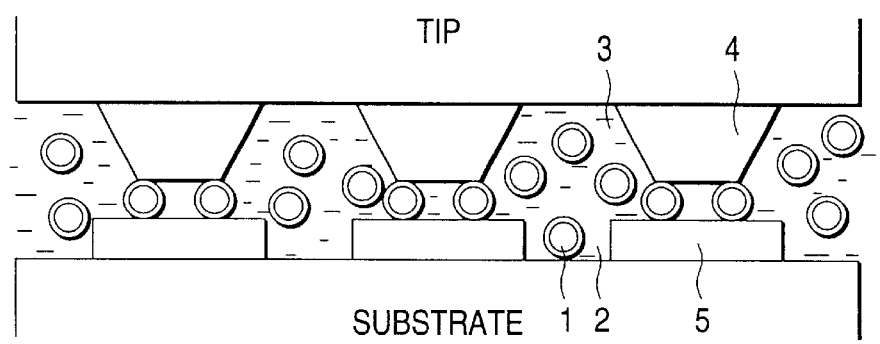
FIG. 4 is a diagram schematically showing how electronic components are interconnected using an anisotropic conductive adhesive containing the microencapsulated electroconductive filler prepared in accordance with the invention.
Figure 5:
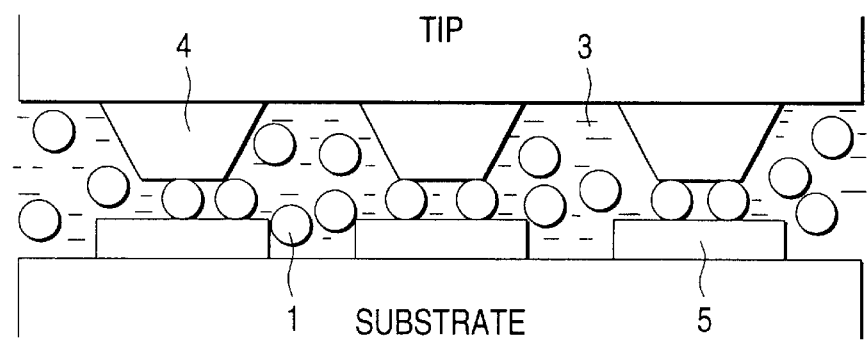
FIG. 5 is a diagram schematically showing how electronic components are interconnected using a conventional anisotropic conductive adhesive.

The interconnections are partially shown in FIG. 4. To make the interconnections, a plurality of bumps 4 having an electrode and a plurality of pads 5 also having an electrode were thermocompressed with an interposed layer of the microencapsulated anisotropic conductive adhesive 3. As schematically shown in FIG. 4, the conductive filler particles 1 made a current path only between the electrodes of opposed bump 4 and pad 5, but the insulating resin layer 2 formed on the surfaces of the filler particles 1 prevented the occurrence of shorting between the electrode on one bump 4 and the electrode on adjacent pad 5.

EXAMPLE 2

A microencapsulated conductive filler was prepared by the same method under the same conditions as in Example 1, except that the average size of the conductive Ag particles was changed to 3 $\mu$m. The thus prepared filler was evaluated for the same parameters as in Example 1.

Insulating Property of Microencapsulated Conductive Filler

The filler was found to have the same level of insulating property as in Example 1.

Conduction Resistance

The results were substantially the same as those obtained in Example 1.

Insulation Resistance

The results were substantially the same as those obtained in Example 1.

EXAMPLE 3

A microencapsulated conductive filler was prepared by the same method and under the same conditions as in Example 1, except that the addition amount of the titanate-base coupling agent was reduced to 3.0 g. The thus prepared filler was evaluated for the same parameters as those in Example 1.

Insulating Property of Microencapsulated Conductive Filler

The results are shown in Table 1 above. The filler was found to have satisfactory insulating property on a comb-shaped electrode having 40-$\mu$m gaps, but shorting occurred in a comb-shaped electrode having 20-$\mu$m gaps. It was therefore confirmed that the microcapsules of conductive filler prepared in Example 3 had a thinner insulating resin layer than those prepared in Example 1.

Conduction Resistance

The results were substantially the same as those obtained in Example 1.

Insulation Resistance

The results were substantially the same as those obtained in Example 1.

The above results show that the microencapsulated anisotropic conductive adhesive using the microcapsules of conductive filler prepared in Example 3 were practically feasible under the conditions (i.e., the pitch of bumps and the pressure for thermocompression) that were employed in the evaluations. It should, however, be noted that certain troubles might occur with a bump pitch smaller than 20 $\mu$m. On the other hand, in the case where the pressure for thermocompression has to be reduced, the microcapsules of conductive filler prepared in Example 3 which have a thinner insulating resin coat are more advantageous in terms of conduction resistance.

It was therefore confirmed from the results in Examples 1 to 3 that the present invention provides a process for producing microcapsules of a conductive filler that are practically applicable to a microencapsulated anisotropic conductive adhesive. Further, it was also confirmed that the thickness of the insulating resin coat on the surfaces of the individual microcapsules can be effectively controlled according to the present invention.

To summarize, the present invention offers the following advantages. By using the process of the invention for producing a microencapsulated conductive filler, an insulating resin coat can be efficiently applied to various types of fine conductive particles in a very simple step. Secondly, if the reactant B contains very few amounts of impurities, the microencapsulated conductive filler is sufficiently protected against the entrance of corrosive ions and the like, so that it is practically applicable for use as a conductive material in establishing electrical interconnections between electrodes on an IC and those on a matching substrate. Thirdly, when an anisotropic conductive adhesive containing the microcapsules of conductive filler is to be used in connecting and sealing a flip chip, the thickness of the insulating resin coat to be formed on the surfaces of the individual microcapsules of conductive filler can be effectively controlled depending on the pressure conditions.

While the invention has been described in detail and with reference to specific examples thereof, it will be apparent to one skilled in the art that various changes and modifications can be made therein without departing from the spirit and scope thereof.

What is claimed is:

1. A process for producing a microencapsulated electro-conductive filler comprising conductive filler particles each having an insulating resin layer coated on the surface thereof, which comprises:

a first step of treating the surfaces of conductive filler particles with a coupling agent having reactive functional group A at a terminal end or in a side chain of its molecule; and a second step of allowing said coupling agent having functional group A present on the surfaces of said conductive filler particles to undergo nonaqueous polymerization reaction with a reactant B which is polymerization with said functional group A, to thereby form an insulating resin layer on the surfaces of said conductive filler particles.

2. The process according to claim 1, wherein said coupling agent having functional group A used in said first step is at least one compound selected from the group consisting of an aluminum-base coupling agent, a titanate-base coupling agent, a silane-base coupling agent and a zircoaluminate-base coupling agent.

3. The process according to claim 1, wherein the addition amount of said coupling agent having functional group A in said first step is from 0.1 to 15 wt % based on the weight of said conductive filler particles to be treated.

4. The process according to claim 1, wherein said surface treatment of said first step comprises the steps of:

dissolving said coupling agent having functional group A in a solvent to form a solution of said coupling agent; and then dispersing said conductive filler particles into the solution.

5. The process according to claim 4, wherein said dispersing step to disperse said conductive filler particles into the solution is conducted by mixing with agitation.

6. The process according to claim 4, wherein said dispersing step to disperse said conductive filler particles into the solution is conducted by applying ultrasonic waves with agitation.

7. The process according to claim 1, wherein said coupling agent is an amine compound having an amino or imino group as said functional group A, and said reactant B is a compound having an epoxy group at a terminal end or in a side chain of its molecule.

8. The process according to claim 1, wherein said coupling agent is an epoxy compound having an epoxy group as said functional group A, and the reactant B is an amine compound having an amino or imino group at a terminal end or in a side chain of its molecule.

9. The process according to claim 1, wherein said second step comprises dispersing said coupler-treated conductive filler particles uniformly in the reactant B.

10. The process according to claim 9, wherein said second step further comprises performing polymerization reaction between the reactant B and the coupling agent having functional group A under agitation.

11. The process according to claim 9, wherein said dispersing step to disperse said coupler-treated conductive filler particles uniformly in said reactant B is conducted using an agitator running at an agitation rate of 2,000 to 10,000 rpm.

12. The process according to claim 11, wherein the reactant B is of a liquid nature.

13. The process according to claim 12, wherein said reactant B has a viscosity of 20 to 20,000 mPa·s (25° C.).

14. The process according to claim 1, wherein said second step is conducted while heating the reaction system to from 40 to 60° C.

15. The process according to claim 1, wherein said second step further comprises adding a polymerization catalyst to the reaction system.

16. The process according to claim 1, wherein thickness of the insulating resin layer is not more than 3 $\mu$m.

17. The process according to claim 1, wherein said conductive filler particles have a spherical or pseudospherical shape.

18. The process according to claim 1, wherein the diameter of said conductive filler particles is 50 $\mu$m or less.

19. The process according to claim 1, wherein said conductive filler particles comprise particles selected from the group consisting of Ag particles and Cu particles coated with Ag.

20. The process according to claim 1, wherein the amount of coupling agent added is 0.1 to 15 wt. % based on the weight of the conductive filler particles.

21. The process according to claim 1, further comprising isolating the conductive filler particles coated with insulating resin from unreacted reactant B.

* * * * *